United States Patent
Sugawara

(10) Patent No.: US 11,728,458 B2
(45) Date of Patent: Aug. 15, 2023

(54) SEMICONDUCTOR LIGHT-EMITTING DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hideto Sugawara, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 149 days.

(21) Appl. No.: 17/461,874

(22) Filed: Aug. 30, 2021

(65) Prior Publication Data

US 2022/0231191 A1 Jul. 21, 2022

(30) Foreign Application Priority Data

Jan. 15, 2021 (JP) .................................. 2021-005297

(51) Int. Cl.
 *H01L 33/04* (2010.01)
 *H01L 33/30* (2010.01)

(52) U.S. Cl.
 CPC ............. *H01L 33/04* (2013.01); *H01L 33/30* (2013.01)

(58) Field of Classification Search
 CPC .................................. H01L 33/04; H01L 33/30
 See application file for complete search history.

(56) References Cited

U.S. PATENT DOCUMENTS

| 2010/0118906 | A1* | 5/2010 | Yamamoto | B82Y 20/00 977/755 |
|---|---|---|---|---|
| 2018/0331257 | A1* | 11/2018 | Lee | H01L 33/30 |
| 2021/0057605 | A1 | 2/2021 | Sugawara | |
| 2021/0391502 | A1* | 12/2021 | Watanabe | H01L 21/02576 |

FOREIGN PATENT DOCUMENTS

| JP | 4554526 B2 | 9/2010 |
|---|---|---|
| JP | 2010-258134 A | 11/2010 |
| JP | 6213729 B2 | 10/2017 |
| JP | 2021-034497 A | 3/2021 |

* cited by examiner

*Primary Examiner* — Mark W Tornow
(74) *Attorney, Agent, or Firm* — Kim & Stewart LLP

(57) ABSTRACT

A semiconductor light-emitting device includes a semiconductor substrate and a light-emitting layer on the semiconductor substrate. The light-emitting layer includes at least one quantum well layer and barrier layers alternately stacked. The quantum well layer includes a first semiconductor mixed crystal having a larger lattice constant than a lattice constant of the semiconductor substrate. The barrier layers each includes a second semiconductor mixed crystal having a smaller lattice constant than the lattice constant of the semiconductor substrate. The quantum well layer includes a first strain amount that is a product of the layer thickness thereof and a first strain ratio. The barrier layer each includes a second strain amount that is a product of the layer thickness thereof and a second strain ratio. The quantum well layer and the barrier layers are provided such that the first strain amount is greater than the second strain amount.

12 Claims, 8 Drawing Sheets

← InGaAs QUANTUM WELL LAYER 103a
← GaAs PBARRIER LAYER 103b

[002]

← InGaAs
← AlGaAs
← GaAsP

LAYER THICKNESS DIRECTION

[220]

{ InGaAs
  AlGaAs
  GaAsP

LAYER THICKNESS DIRECTION

SEMICONDUCTOR LIGHT-EMITTING DEVICE

CROSS-REFERENCE TO RELATED APPLICATIONS

This application is based upon and claims the benefit of priority from Japanese Patent Application No. 2021-005297, filed on Jan. 15, 2021; the entire contents of which are incorporated herein by reference.

FIELD

Embodiments relate to a semiconductor light-emitting device.

BACKGROUND

A photocoupler in which an infrared light-emitting element and a silicon photodiode are optically combined is widely used. It is desirable for such a light-emitting element to have a high luminous efficiency.

DETAILED DESCRIPTION

According to an embodiment, a semiconductor light-emitting device includes a semiconductor substrate and a light-emitting layer. The light-emitting layer is provided on the semiconductor substrate. The light-emitting layer includes at least one quantum well layer and barrier layers alternately stacked in a first direction directed from the semiconductor substrate toward the light-emitting layer. The quantum well layer includes a first semiconductor mixed crystal having a larger lattice constant than a lattice constant of the semiconductor substrate. The quantum well layer includes a first layer thickness in the first direction and a first strain amount. The first strain amount is a product of the first layer thickness and a first strain ratio. The first strain ratio is obtained by dividing an absolute value of a difference between the lattice constant of the substrate and a lattice spacing of the first semiconductor mixed crystal in the first direction by the lattice spacing of the first semiconductor mixed crystal. The barrier layers each includes a second semiconductor mixed crystal having a smaller lattice constant than the lattice constant of the semiconductor substrate. The barrier layer each includes a second layer thickness in the first direction and a second strain amount. The second strain amount is a product of the second layer thickness and a second strain ratio. The second strain ratio is obtained by dividing an absolute value of a difference between the lattice constant of the substrate and a lattice spacing of the second semiconductor mixed crystal in the first direction by the lattice spacing of the second semiconductor mixed crystal. The quantum well layer and the barrier layers are provided such that the first strain amount is greater than the second strain amount.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

Figure 1A:
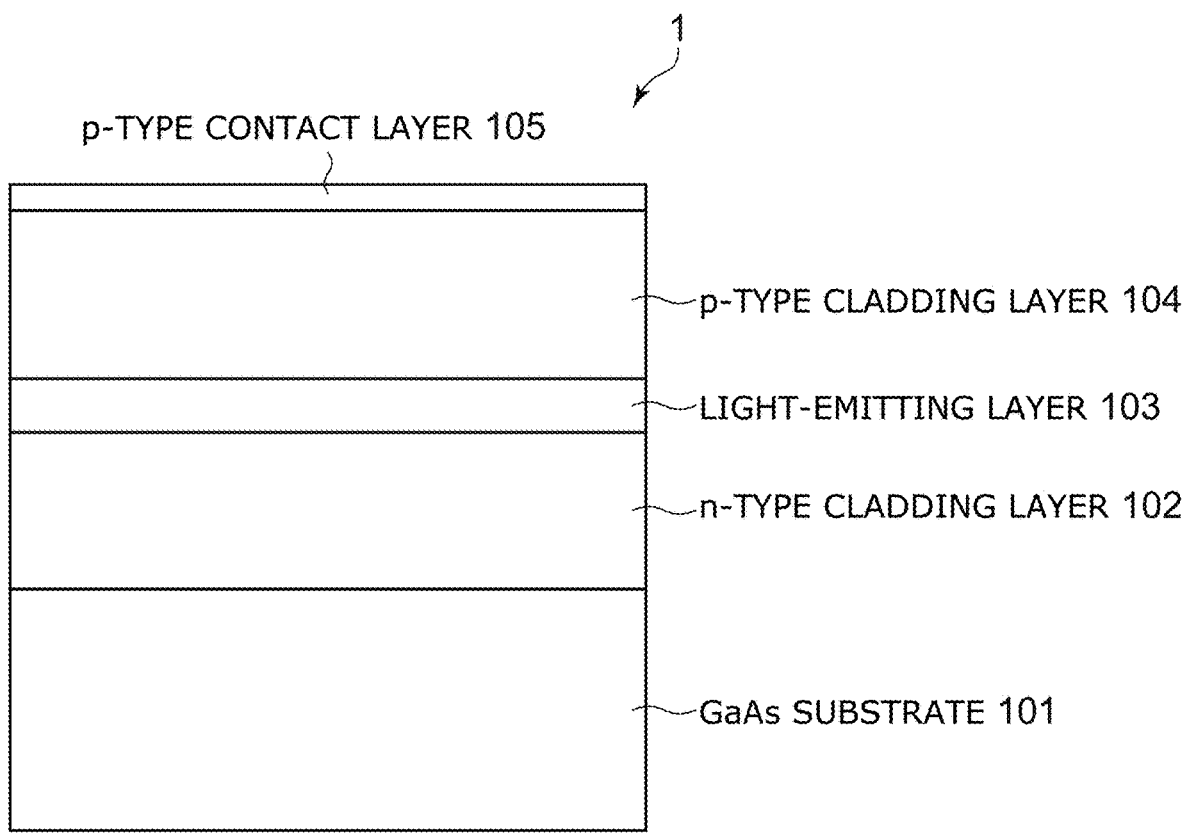
FIGS. 1A and 1B are schematic cross-sectional views showing a semiconductor light-emitting device according to an embodiment.
Figure 1B:
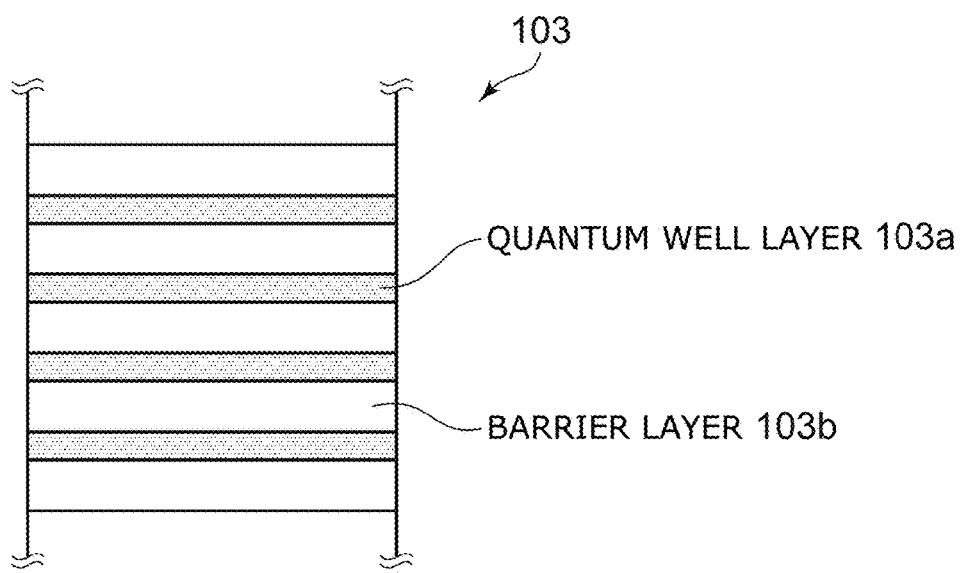

FIGS. 1A and 1B are schematic cross-sectional views showing a semiconductor light-emitting device 1 according to an embodiment. FIG. 1A illustrates a structure of a semiconductor layer that is epitaxially grown on an n-type GaAs substrate. FIG. 1B illustrates a structure of a light-emitting layer. The semiconductor light-emitting device 1 is an infrared light-emitting diode (LED).

As shown in FIG. 1A, the semiconductor light-emitting device 1 includes an n-type GaAs substrate (hereinbelow, a GaAs substrate 101), an n-type cladding layer 102, a light-emitting layer 103, a p-type cladding layer 104, and a p-type contact layer 105.

The n-type cladding layer 102 is provided on the GaAs substrate 101. The n-type cladding layer 102 includes, for example, an AlGaAs mixed crystal represented by the compositional formula $Al_{0.5}Ga_{0.5}As$.

The light-emitting layer 103 is provided between the n-type cladding layer 102 and the p-type cladding layer 104. The light-emitting layer 103 includes a multi-quantum well structure (Multi-Quantum Well: MQW).

The p-type cladding layer 104 is provided on the light-emitting layer 103. The p-type cladding layer 104 includes, for example, an AlGaAs mixed crystal represented by the compositional formula $Al_{0.5}Ga_{0.5}As$.

The p-type contact layer 105 is provided on the p-type cladding layer 104. The p-type contact layer 105 is, for example, a GaAs layer. The p-type contact layer 105 is, for example, the uppermost layer, and is provided to form an electrode thereon.

As shown in FIG. 1B, the light-emitting layer 103 has a MQW structure that includes quantum well layers 103a and barrier layers 103b. The quantum well layers 103a and the barrier layers 103b are alternately stacked. A quantum well layer 103a is provided between adjacent barrier layers 103b. The quantum well layer 103a includes, for example, an InGaAs mixed crystal represented by the compositional formula $In_{0.2}Ga_{0.8}As$. The barrier layer 103b includes, for example, a GaAsP mixed crystal represented by the compositional formula $GaAs_{0.9}P_{0.1}$.

The light-emitting layer 103 includes, for example, four layers of quantum well layers 103a. For example, the quantum well layer 103a has a layer thickness of 5.8 nanometers (nm) and emits infrared light having a wavelength of 950 nm. Hereinbelow, the "layer thickness" is the thickness in a stacking direction that is directed from the GaAs substrate 101 toward the p-type contact layer 105.

Figure 2:
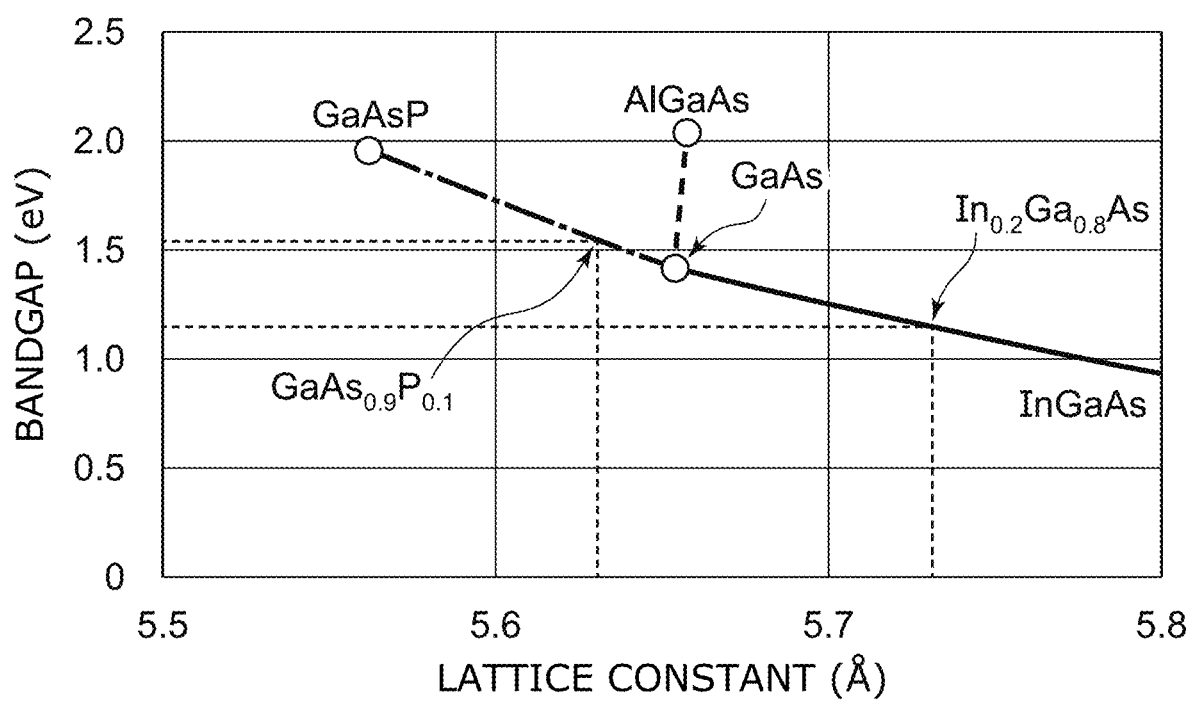
FIG. 2 is a graph showing the relationship between the lattice constant and the energy bandgap of GaAs-based direct bandgap compound semiconductor materials.

FIG. 2 is a graph showing the relationship between the lattice constant and the energy bandgap of GaAs-based direct bandgap compound semiconductor materials. FIG. 2 illustrates the relationship between the lattice constant and the energy bandgap corresponding to the compositions of AlGaAs, GaAsP and InGaAs mixed crystals. The relationship is illustrated with GaAs at the center.

In an InGaAs mixed crystal represented by the compositional formula $In_XGa_{1-X}As$ (0<X<1), the energy bandgap narrows and the lattice constant increases as the In composition "X" increases. The energy bandgap of the InGaAs mixed crystal is narrower than the energy bandgap of GaAs. The lattice constant of the InGaAs mixed crystal is greater than the lattice constant of GaAs.

The InGaAs mixed crystal of the quantum well layer 103a includes, for example, an In composition of X=0.2, a lattice constant of 5.73 angstroms (Å), and an energy bandgap of 1.14 electron volts (eV).

In a GaAsP mixed crystal represented by the compositional formula $GaAs_{1-Y}P_Y$ (0<Y<1), the energy bandgap widens and the lattice constant decreases as the P composition "Y" increases. The energy bandgap of the GaAsP mixed crystal is wider than the energy bandgap of GaAs. The lattice constant of the GaAsP mixed crystal is less than the lattice constant of GaAs.

The GaAsP mixed crystal of the barrier layer 103b includes, for example, a P composition of Y=0.1, a lattice constant of 5.63 Å, and an energy bandgap of 1.51 eV.

In an AlGaAs mixed crystal represented by the compositional formula $Al_ZGa_{1-Z}As$ (0<Z<1), the energy bandgap widens as the Al composition "Z" increases. The energy bandgap of the AlGaAs mixed crystal is wider than the energy bandgap of GaAs. On the other hand, the change of the lattice constant of AlGaAs corresponding to the change of the Al composition "Z" is small.

An InGaAs mixed crystal shown in FIG. 2 is widely used as the light-emitting material of the infrared light-emitting element. A photocoupler, for example, comprises the light-emitting diode (LED) that includes the light-emitting material of the InGaAs mixed crystal. The LED used in the photocoupler has the light emission wavelength adjusted to be in a wavelength region around 1000 nm, for example, in which a Si photodiode (PD) has high photosensitivity.

For example, when an InGaAs mixed crystal is used in the light-emitting layer 103 as the quantum well layer 103a of the MQW structure, the In composition X of the InGaAs mixed crystal is adjusted to be in the range of 0.15 to 0.2. Among the compound semiconductor materials, for example, practically used for an epitaxial growth substrate, GaAs has the lattice constant nearest to the lattice constant of the InGaAs mixed crystal that has such a composition X. Therefore, it is preferable for the light-emitting layer 103 to be formed on a GaAs substrate. Also, the barrier layer 103b included in the MQW and the other constituent materials of the LED are formed using compound semiconductors such as GaAsP and AlGaAs mixed crystals and the like, which have lattice constants close to the lattice constant of GaAs substrate.

One method used for making these compound semiconductor mixed crystals is Metal-Organic Chemical Vapor Deposition (MOCVD). The GaAs substrate 101 is heated in MOCVD, and various raw materials for crystal growth, e.g., at least two of trimethylindium $(CH)_3In$ (TMI), trimethylgallium $(CH)_3Ga$ (TMG), or trimethylaluminum $(CH)_3Al$ (TMA), and at least one of arsine $AsH_3$ or phosphine $PH_3$ are supplied to the front surface of the substrate and thermally decomposed. Thereby, the desired compound semiconductor mixed crystals can be deposited on the GaAs substrate 101. The basic structure of the LED (referring to FIGS. 1A and 1B), for example, can be formed by sequentially depositing each compound semiconductor mixed crystal while controlling the layer thickness thereof by the supply amount and supply period of the raw materials.

The InGaAs mixed crystal has a lattice constant close to the lattice constant of the GaAs substrate, but both the lattice constants do not match to each other, and thus, there is the lattice mismatch between them. Therefore, lattice strain due to the lattice mismatch is induced while the InGaAs mixed crystal is deposited on the GaAs substrate. The lattice strain increases as the layer thickness of the deposited layer increases. When the lattice strain in the deposited layer exceeds a critical point, the lattice relaxation may take place, and crystal defects are generated in the crystal. Thus, the light emission characteristics are degraded in the light-emitting layer 103.

According to an embodiment, the light-emitting layer 103 includes a strain-compensation-type MQW structure to prevent the degradation of the light emission characteristics. The strain-compensation-type MQW structure includes, for example, a quantum well layer 103a of the InGaAs mixed crystal and a barrier layer 103b of the GaAsP mixed crystal.

As shown in FIG. 2, the GaAsP mixed crystal is suitable as the material of the barrier layer 103b because the GaAsP mixed crystal has a wider energy bandgap than the InGaAs mixed crystal. Also, the lattice mismatch between the GaAsP mixed crystal and the GaAs substrate is opposite to the lattice mismatch between the InGaAs mixed crystal and the GaAs substrate. By providing such a GaAsP mixed crystal to be adjacent to the InGaAs mixed crystal, the strain amounts due to the lattice mismatches to the GaAs substrate can be cancelled.

When such a strain-compensation-type MQW structure is provided, the quantum well layer 103a and the barrier layer 103b are generally formed with the layer thicknesses such that the strain amounts dependent thereon are balanced. The strain amounts are determined by, for example, the lattice constant difference between the GaAs substrate and each of the compound semiconductor mixed crystals and the layer thicknesses of the compound semiconductor mixed crystals.

The composition X and layer thickness of the InGaAs mixed crystal in the quantum well layer 103a is provided based on the light emission wavelength of the light-emitting layer 103. The composition Y of the GaAsP mixed crystal in the barrier layer 103b is provided with priority to the carrier confinement effect in the quantum well layer 103a. Thus, the strain amounts of the quantum well layer 103a and the barrier layer 103b are controlled by the layer thickness of the barrier layer 103b. In such a case, the layer thickness of the barrier layer 103b is provided within a range where the lattice relaxation due to excessive strain does not take place. In other words, the layer thickness of the barrier layer 103b is provided within a range where the crystal lattice of the light-emitting layer 103 is deformed elastically.

Thus, even when a compound semiconductor mixed crystal may have a large lattice strain due to the GaAs substrate 101, the MQW structure can be configured such that the crystal lattice strain does not exceed the critical point of the elastic deformation by combining another compound semiconductor mixed crystal that compensates the lattice strain, and the light emission characteristics can be improved. However, such a strain-compensated structure includes structural parameters that are exactly determined with a narrow tolerance range. There may be a shift from the determined values due to fluctuation in the manufacturing processes of LED, which causes variation and/or degradation of the light emission characteristics. According to the embodiment, the semiconductor light-emitting device 1 may have a configuration that can solve such discrepancies.

Example

The semiconductor light-emitting device 1 includes a strain-compensation-type MQW structure in which the layer thickness $d_{bar}$ of the barrier layer 103b is changed to be 9.1 nm, 20 nm, and 30 nm.

Figure 3A:
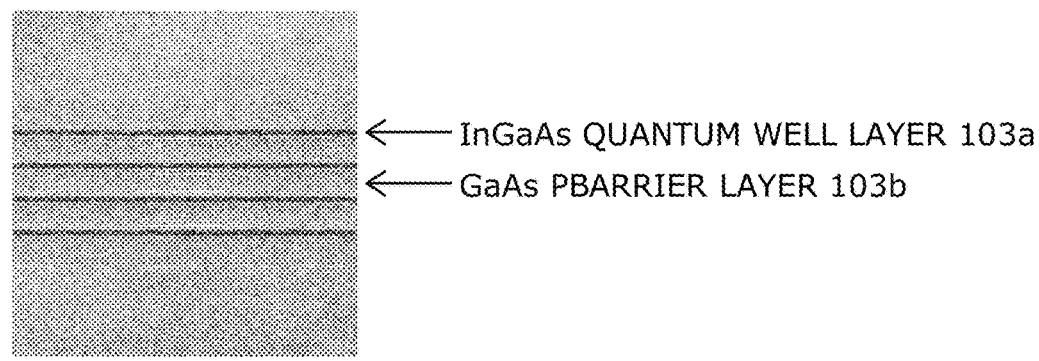
FIGS. 3A to 3C are a Transmission Electron Microscope image (TEM image) and lattice spacing images of a light-emitting layer according to the embodiment.

FIG. 3A is a cross-sectional TEM image of the light-emitting layer 103.

Figure 3B:
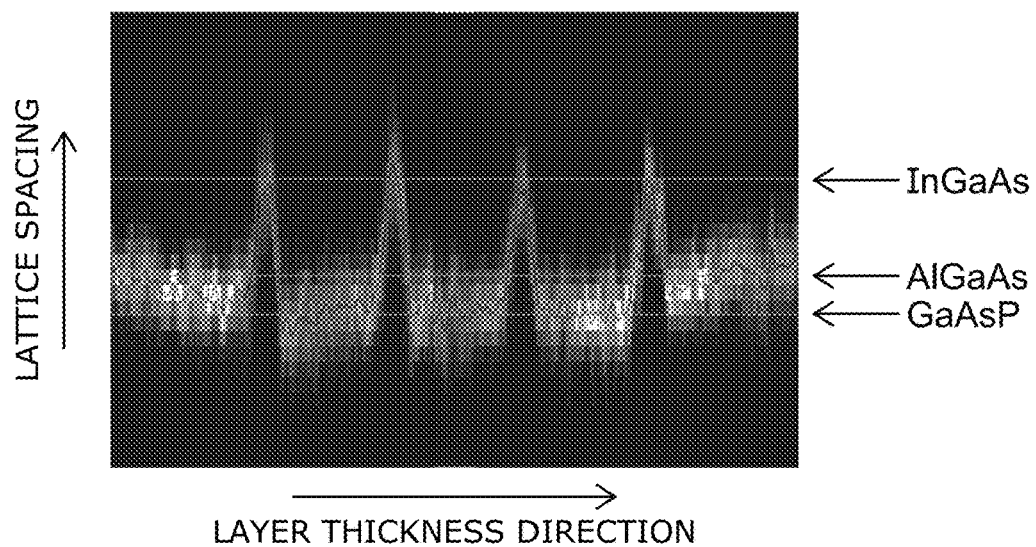
Figure 3C:
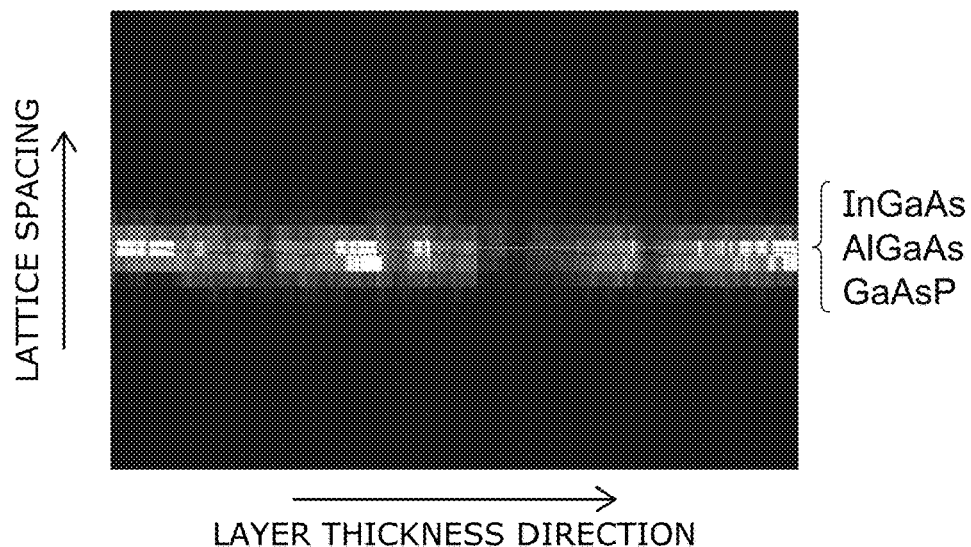

FIGS. 3B and 3C are heat maps illustrating the lattice spacing visualized using fast Fourier transform mapping (FFTM). The lattice spacing shown in FIGS. 3B and 3C are obtained by performing Fourier transform analysis based on the cross-section TEM image of FIG. 3A. The light-emitting layer 103 shown in the example includes the barrier layer 103b that has a layer thickness $d_{bar}$ equal to 30 nm.

As shown in FIG. 3A, the light-emitting layer 103 includes four layers of quantum well layers 103a. The barrier layer 103b is provided above and below each quantum well layer 103a. It can be seen that the boundary between the quantum well layer 103a and the barrier layer 103b is flat, and there is no misfit dislocation.

FIG. 3B illustrates the lattice spacing in the <002> crystal direction. FIG. 3C illustrates the lattice spacing in the <220> crystal direction. "InGaAs" shown in FIGS. 3B and 3C is the $In_{0.2}Ga_{0.8}As$ mixed crystal of the quantum well layer 103a; and "GaAsP" is the $GaAs_{0.9}P_{0.1}$ mixed crystal of the barrier layer 103b. "AlGaAs" is the $Al_{0.5}Ga_{0.5}As$ mixed crystal of the n-type and p-type cladding layers 102 and 104.

In the <002> direction as shown in FIG. 3B, it can be seen that the lattice spacing of the $In_{0.2}Ga_{0.8}As$ mixed crystal is wider and the lattice spacing of the $GaAs_{0.9}P_{0.1}$ mixed crystal is narrower than the lattice spacing of the $Al_{0.5}Ga_{0.5}As$ mixed crystal.

In the <220> direction shown in FIG. 3C, it can be seen that the lattice spacings of the $In_{0.2}Ga_{0.8}As$ mixed crystal, the $GaAs_{0.9}P_{0.1}$ mixed crystal, and the $Al_{0.5}Ga_{0.5}As$ mixed crystal are uniform and substantially constant. For example, the $Al_{0.5}Ga_{0.5}As$ mixed crystal may be considered to have lattice matching with GaAs. Accordingly, the lattice spacing in the crystal plane perpendicular to the stacking direction of the quantum well layer 103a and the barrier layer 103b is considered to match the lattice spacing of the GaAs substrate 101.

In contrast, the lattice spacing in the stacking direction of the quantum well layer 103a and the barrier layer 103b does not match the lattice spacing of the GaAs substrate 101 (referring to FIG. 3B), and the lattice spacing of the quantum well layer 103a is wider in the stacking-direction than the lattice spacing of the GaAs substrate 101. Also, the lattice spacing of the barrier layer 103b is narrower in the stacking-direction than the lattice spacing of the GaAs substrate 101. In other words, the lattice of the quantum well layer 103a and the lattice of the barrier layer 103b are deformed along the stacking direction due to the GaAs substrate, and the lattice deformation direction of the quantum well layer 103a is opposite to the lattice deformation direction of the the barrier layer 103b. Therefore, the quantum layer 103a and the barrier layer 103b are stacked mutually while the strains thereof with respect to the GaAs substrate 101 are compensated each other.

Table 1 shows physical property values of the $In_{0.2}Ga_{0.8}As$ mixed crystal in the quantum well layer 103a and the $GaAs_{0.9}P_{0.1}$ mixed crystal in the barrier layer 103b. The physical property values of the ternary crystals shown in the table are proportionally weighted based on Vegard's law using the two end-composition constituents (InAs, GaAs, and GaP).

TABLE 1

| MATERIAL | LATTICE CONSTANT a | ELASTICITY MODULUS ($10^{11}$ dyn/cm$^2$) | | DEFORMATION FACTOR C11/(C11 + 2 × C12) | PERPENDICULAR ELASTIC DEFORMATION a⊥ | \| STRAIN AMOUNT WITH RESPECT TO GaAs \| ε |
|---|---|---|---|---|---|---|
| | | C11 | C12 | | | |
| InAs | 6.05840 | 8.3290 | 4.5260 | 0.4792 | 6.49866 | 0.13008 |
| $In_{0.2}Ga_{0.8}As$ | 5.73432 | 11.1698 | 5.2092 | 0.5174 | 5.80989 | 0.02695 |
| GaAs | 5.65330 | 11.8800 | 5.3800 | 0.5247 | 5.65330 | 0.00000 |
| $GaAs_{0.9}P_{0.1}$ | 5.63309 | 12.1040 | 5.4673 | 0.5254 | 5.61483 | 0.00685 |
| GaP | 5.45120 | 14.1200 | 6.2530 | 0.5303 | 5.27220 | 0.07228 | the relationship between the elasticity modulus and the lattice deformation amount of the compound semiconductor mixed crystal is represented by the following formula.

$$\Delta a/a_s = (C_{11}/(C_{11}+2\times C_{12}))\times(\Delta a^\perp/a_s)$$

Here, $a_s$ is the lattice constant of the GaAs substrate 101. Δa is the difference between the lattice constant of the compound semiconductor mixed crystal with no lattice deformation and the lattice constant $a_s$ of the GaAs substrate. $\Delta a^\perp$ is the difference between the stacking-direction lattice spacing of the compound semiconductor mixed crystal with the lattice deformation and the lattice constant $a_s$ of the GaAs substrate 101. $C_{ij}$ is the elastic stiffness constant.

A strain ratio ε of the compound semiconductor mixed crystal with respect to the GaAs substrate is defined by the following formula as the absolute value of the difference between the stacking-direction lattice spacing $a^\perp$ of the compound semiconductor mixed crystal and the lattice constant $a_s$ of the GaAs substrate divided by $a^\perp$.

$$\varepsilon = |a^\perp - a_s|/a^\perp$$

The stacking-direction strain amount in the compound semiconductor crystal is represented by, for example, the product of the strain ratio ε and the layer thickness. The balance of the strain amount between the quantum well layer 103a and the barrier layer 103b, for example, is defined by the following formula, wherein the strain ratio of the quantum well layer 103a is $\varepsilon_{well}$, and the strain ratio of the barrier layer 103b is $\varepsilon_{bar}$.

$$\varepsilon_{well} \times d_{well} = \varepsilon_{bar} \times d_{bar}$$

Here, $d_{well}$ is the layer thickness of the quantum well layer 103a; and $d_{bar}$ is the layer thickness of the barrier layer 103b. For example, when the layer thickness $d_{well}$ of the $In_{0.2}Ga_{0.8}As$ mixed crystal of the quantum well layer 103a is provided to be 5.8 nm to obtain a light emission wavelength of about 950 nm, the layer thickness $d_{bar}$ of the $GaAs_{0.9}P_{0.1}$ mixed crystal (the barrier layer 103b) based on the strain balance is 22.8 nm.

Figure 4A:
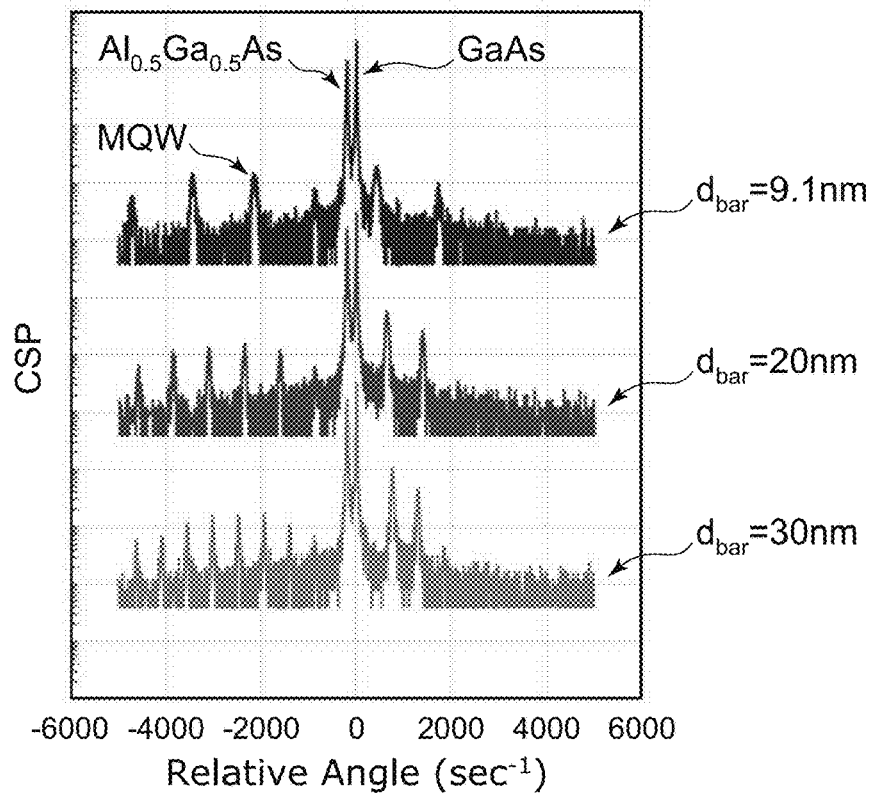
FIGS. 4A and 4B are charts showing X-ray diffraction spectra of the light-emitting layer according to the embodiment.
Figure 4B:
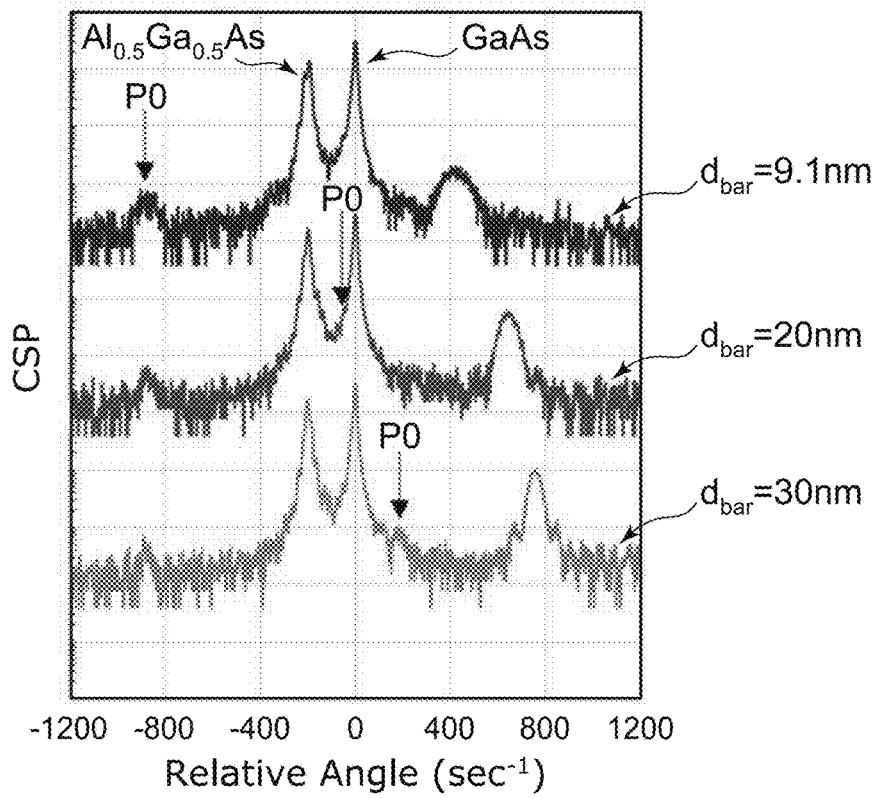

FIGS. 4A and 4B are X-ray diffraction spectra of the light-emitting layer 103. In FIG. 4B, the horizontal axis of the X-ray diffraction spectra shown in FIG. 4A is enlarged. In FIGS. 4A and 4B, the X-ray diffraction evaluation of three structures are shown in which the barrier layers 103b have the layer thicknesses $d_{bar}$ of 9.1 nm, 20 nm and 30 nm, respectively.

As shown in FIG. 4A, X-ray diffraction spectra include diffraction peaks corresponding to the GaAs substrate 101 and the $Al_{0.5}Ga_{0.5}As$ mixed crystal included in the p-type and n-type cladding layers 102 and 104. Multiple satellite peaks corresponding to the MQW structure are also included.

The satellite peaks have a spacing (a period) that corresponds to the period of the MQW structure. For example, the period of the satellite peaks decreases as the layer thickness $d_{bar}$ of the barrier layer 103b increases.

In the multiple satellite peaks, the zeroth-order peak can be identified based on the period of the satellite peaks in FIG. 4A and the lattice constants of the $In_{0.2}Ga_{0.8}As$ mixed crystal and the $GaAs_{0.9}P_{0.1}$ mixed crystal (referring to Table 1). The zeroth-order peak corresponds to the average lattice spacing of the quantum well layer 103a and the barrier layer 103b.

The arrows in FIG. 4B indicate zeroth-order peaks P0 of the diffraction spectra. As shown in FIG. 4B, the zeroth-order peaks P0 are found to be at the position depending on the layer thickness $d_{bar}$ of the barrier layer 103b.

Figure 5:
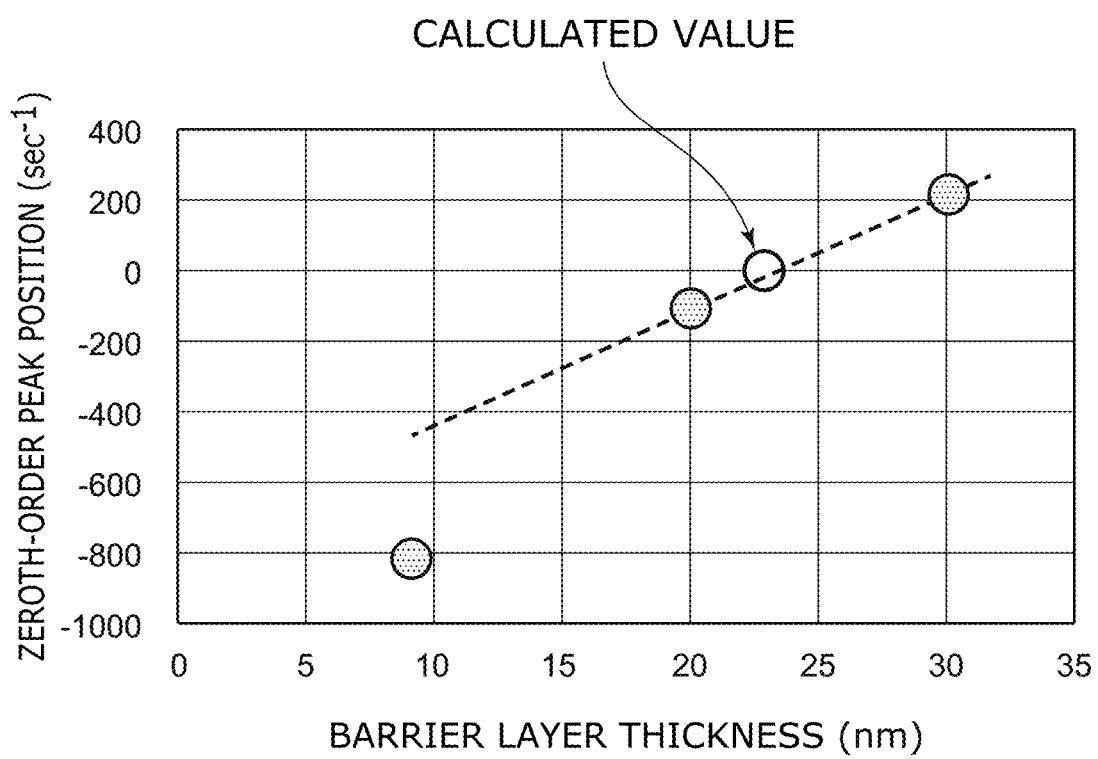
FIG. 5 is a graph illustrating the relationship between a barrier layer thickness of the light-emitting layer and a position of the zeroth-order X-ray diffraction peak.

FIG. 5 is a graph illustrating the relationship between the layer thickness $d_{bar}$ of the barrier layer 103b and the position of the zeroth-order peak P0. The positions of the zeroth-order peaks P0 are plotted with respect to the barrier thicknesses $d_{bar}$ shown in FIG. 4B. The barrier layer thickness (the calculated value) is shown at which the peak position of the GaAs substrate 101 matches the peak position of the zeroth-order peak P0.

As shown in FIG. 5, the diffraction peak of the GaAs substrate 101 is found to be positioned between the zeroth-order peak positions where the layer thicknesses $d_{bar}$ of the barrier layer 103b are 20 nm and 30 nm, respectively.

When the zeroth-order peak of the MQW structure overlaps the diffraction peak of the GaAs substrate 101 (relative angle: 0 sec), the strain amounts of the quantum well layer 103a and the barrier layer 103b are perfectly compensated.

For example, the layer thickness $d_{bar}$ at which the zeroth-order peak of the MQW structure overlaps the diffraction peak of the GaAs substrate 101 is determined based on a line connecting the plot positions in FIG. 5 at which the barrier layer thicknesses $d_{bar}$ are 20 nm and 30 nm, respectively. According to FIG. 5, the layer thickness $d_{bar}$ is about 23 nm when the strain amount of the quantum well layer 103a and the strain amount of the barrier layer 103b are perfectly compensated. This value has a good match with the layer thickness $d_{bar}$ of 22.8 nm that is determined from the balanced-strain condition. When the barrier layer thickness $d_{bar}$ is 9.1 nm, the plot position in FIG. 5A is outside the perfectly strain-compensated relationship. This indicates that the strain balance is significantly degraded between the quantum well layer 103a and the barrier layer 103b.

Figure 6A:
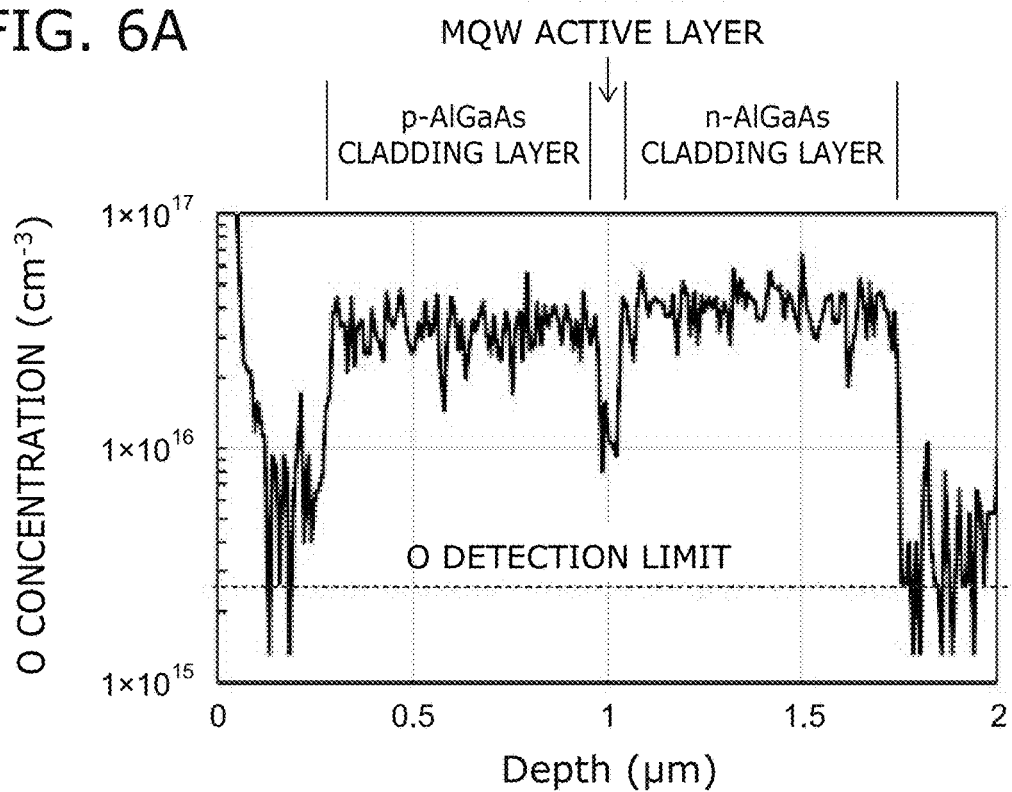
FIGS. 6A and 6B are graphs showing oxygen concentrations incorporated into epitaxial growth layers of the semiconductor light-emitting device according to the embodiment.
Figure 6B:
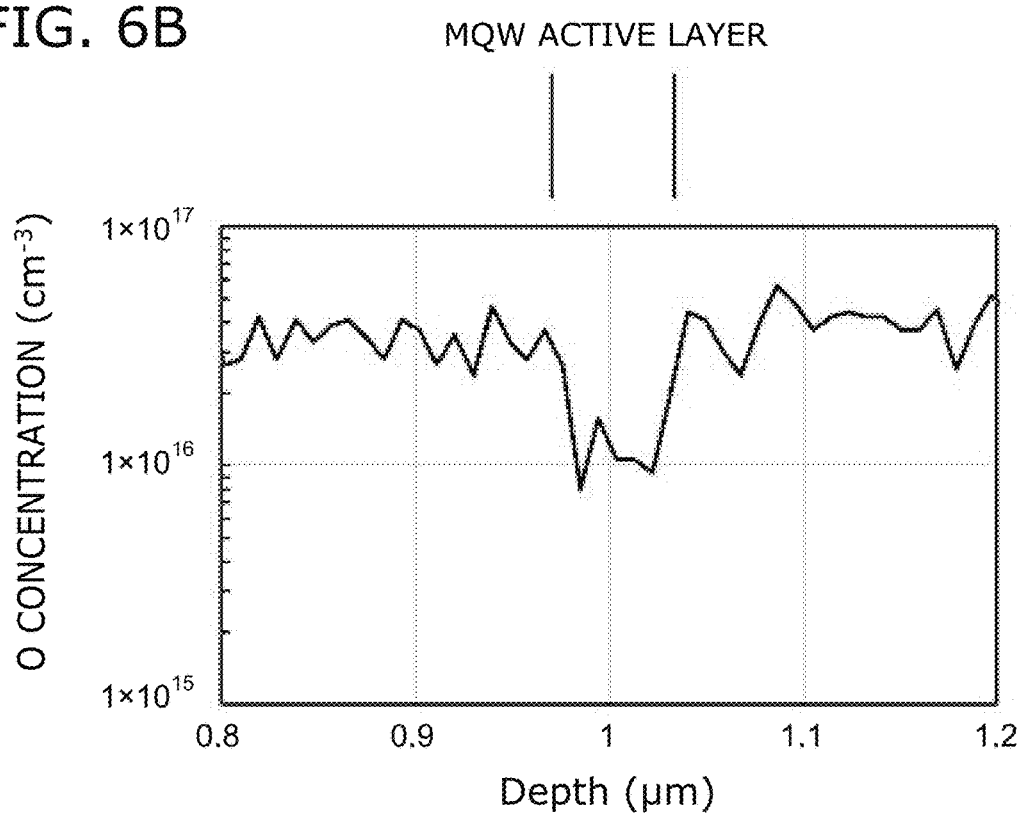

FIGS. 6A and 6B are SIMS (Secondary Ion Mass Spectrometry) profiles showing the distribution of oxygen (O) incorporated into the n-type cladding layer 102, the light-emitting layer 103, and the p-type cladding layer 104. In FIG. 6B, the horizontal axis of FIG. 6A is enlarged to illustrate the oxygen distribution around the light-emitting layer 103.

As shown in FIG. 6A, the n-type cladding layer 102 and the p-type cladding layer 104 have higher oxygen concentrations than the oxygen concentration of the light-emitting layer 103. The n-type cladding layer 102 and the p-type cladding layer 104 are $Al_{0.5}Ga_{0.5}As$ mixed crystals that include aluminum (Al). Therefore, the incorporation of oxygen atoms due to Al—O bonds easily occurs in the epitaxial growth process, because aluminum (Al) has high affinity with oxygen. Under the growth conditions of the embodiment, the n-type cladding layer 102 and the p-type cladding layer 104 have oxygen concentrations of $3 \times 10^{16}$ to $5 \times 10^{16}$ cm$^{-3}$.

As shown in FIG. 6B, the light-emitting layer 103 has an oxygen concentration of about $1 \times 10^{16}$ cm$^{-3}$. In this SIMS measurement, the detection limit of oxygen is a concentration of $2.5 \times 10^{15}$ cm$^{-3}$ below which oxygen cannot be detected. Accordingly, the oxygen concentration of the light-emitting layer 103 shown in FIG. 6B is a significant value.

Normally, the light-emitting layer 103 is formed so that oxygen is not incorporated because oxygen forms non-radiative recombination center. According to the example, the supply conditions of raw materials are preferably provided based on the raw material consumption efficiency in the MOCVD epitaxial growth; and optimizing the growth condition of the InGaAs mixed crystal makes the growth temperature relatively low. As a result, oxygen is incorporated into the light-emitting layer 103.

Figure 7:
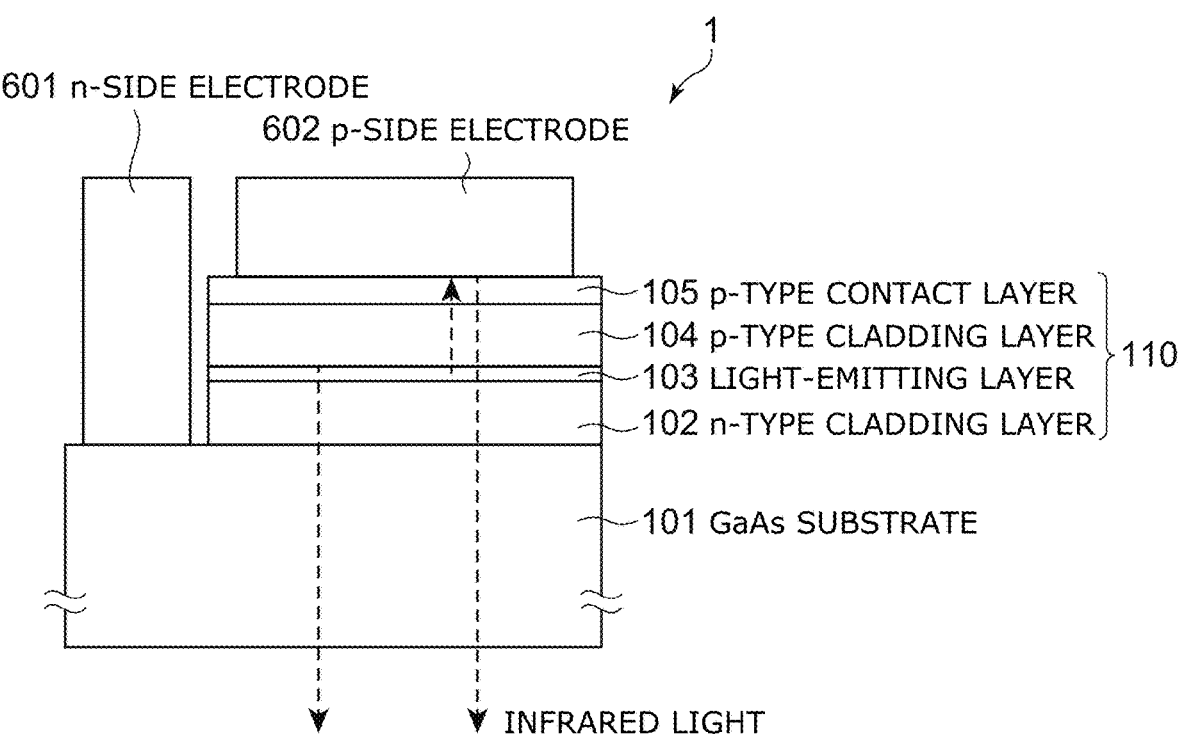
FIG. 7 is a schematic cross-sectional view illustrating a structure of the semiconductor light-emitting device according to the embodiment.

FIG. 7 is a schematic cross-sectional view illustrating the structure of the semiconductor light-emitting device 1.

As shown in FIG. 7, the semiconductor light-emitting device 1 includes a mesa-shaped light-emitting body 110, an n-side electrode 601, and a p-side electrode 602.

The mesa-shaped light-emitting body 110 is provided on the GaAs substrate 101. The mesa-shaped light-emitting body 110 includes the n-type cladding layer 102, the light-emitting layer 103, the p-type cladding layer 104, and the p-type contact layer 105.

The n-side electrode 601 is provided on the front surface of the GaAs substrate 101 and is electrically connected to the GaAs substrate 101. The n-side electrode 601 and the mesa-shaped light-emitting body 110 are arranged on the front surface of the GaAs substrate 101.

The p-side electrode 602 is provided on the p-type contact layer 105 that is the uppermost layer, and is electrically connected to the p-type contact layer 105. The p-side electrode 602 is provided to reflect the infrared light radiated from the light-emitting layer 103. The infrared light propagates toward the direction of the GaAs substrate 101.

The semiconductor light-emitting device 1 is configured so that a driving current flows between the p-side electrode 602 and the n-side electrode 601. The infrared light is generated by the recombination of electrons and holes injected into the light-emitting layer 103 and is radiated externally. The infrared light radiated from the light-emitting layer 103 is externally emitted from the back surface of the GaAs substrate 101.

Figure 8:
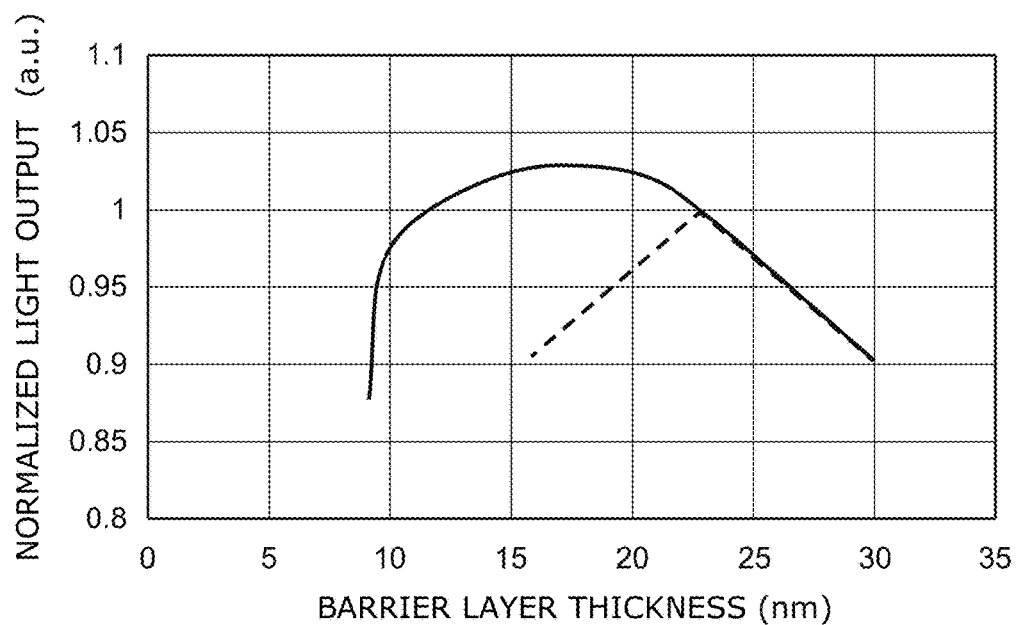
FIG. 8 is a graph showing the relationship between the light output of the semiconductor light-emitting device and the barrier layer thickness.

FIG. 8 is a graph showing the relationship between the light output of the semiconductor light-emitting device 1 and the layer thickness $d_{bar}$ of the barrier layer 103b. The horizontal axis is the layer thickness $d_{bar}$. The vertical axis is the light output. The vertical axis is normalized using the light output at the layer thickness $d_{bar}$ where the strain amounts of the quantum well layer 103a and the barrier layer 103b are balanced.

In FIG. 8, the solid line illustrates the light output of the semiconductor light-emitting device 1. The broken line in FIG. 8 illustrates the light output of a semiconductor light-emitting device according to a comparative example. According to the comparative example, the semiconductor light-emitting device has the same structure as the semiconductor light-emitting device 1, but the light-emitting layer 103 include the oxygen concentration not more than the detection limit of the SIMS measurement.

As shown in FIG. 8, in the semiconductor light-emitting device according to the comparative example, the light output has a maximum at the layer thickness ($d_{bar}$=22.8 nm) at which the strain amount of the quantum well layer 103a and the strain amount of the barrier layer 103b are balanced. In contrast, in the semiconductor light-emitting device 1, the light output has a maximum in a region in which the layer thickness $d_{bar}$ of the barrier layer is less than the layer thickness of balanced strain ($d_{bar}$=22.8 nm). Also, the light output characteristic of the semiconductor light-emitting device 1 has the peak wider than the peak of the light output characteristic of the comparative example.

The light output abruptly falls when the layer thickness $d_{bar}$ of the barrier layer 103b becomes less than 10 nm. As seen in the X-ray diffraction evaluation results (referring to FIG. 5), the light emission characteristic degrades because the balance of the strain amounts in the MQW structure significantly degrades.

As seen in FIG. 8, in the semiconductor light-emitting device 1, it can be seen that the light output improves, for example, in a range where the layer thickness $d_{bar}$ is 0.53 to 1.0 times the layer thickness ($d_{bar}$=22.8 nm) of the barrier layer 103b at which the strain amounts of the MQW structure are balanced. In other words, it is preferable to provide the barrier layer 103b with the layer thickness $d_{bar}$ that is 0.53 to 1.0 times the value obtained by dividing the product of the strain ratio $\varepsilon_{well}$ in the quantum well layer 103a and the layer thickness $d_{well}$ in the stacking direction by the strain ratio $\varepsilon_{bar}$ in the stacking direction of the barrier layer 103b.

Moreover, the strain balance of the MQW structure is also changed by the P composition "Y" of the GaAsP mixed crystal of the barrier layer 103b. By changing the P composition "Y", for example, in the range of 0.053 to 0.1, it is possible to obtain the same strain amount in the barrier layer 103b as the layer thickness $d_{bar}$ changed in the range of 0.53 to 1.0 times the value at which the strain amounts are balanced. In other words, the light output of the semiconductor light-emitting device 1 can be improved by fixing the layer thickness of the barrier layer 103b at $d_{bar}$=22.8 nm and by providing the barrier layer 103b with the GaAsP mixed crystal having the P composition "Y" of of 0.053 to 0.1.

In the ranges described above of the layer thickness $d_{bar}$ and the P composition "Y" of the GaAsP mixed crystal in the barrier layer 103b, the strain amount of the quantum well layer 103a and the strain amount of the barrier layer 103b are not balanced, and the strain amount of the quantum well layer 103a is greater than the strain amount of the barrier layer 103b ($\varepsilon_{well} \times d_{well} > \varepsilon_{bar} \times d_{bar}$). Thus, the light output of the semiconductor light-emitting device 1 is affected by factors other than the balance of the strain amounts (the strain compensation) in the MQW structure.

In FIG. 8, the light output characteristics of the semiconductor light-emitting device 1 and the semiconductor light-emitting device of the comparative example show the effect of oxygen in the compound semiconductor mixed crystals. In other words, the light emission characteristic depends on the amount of oxygen incorporated into the light-emitting layer 103.

It is known that the existence of oxygen in a compound semiconductor mixed crystal may affect the hardness of the crystal. The oxygen in the mixed crystal, for example, may change the elasticity modulus and contributes to the improvement of the light emission output in the range in which the balance of the strain amounts between the quantum well layer 103a and the barrier layer 103b is degraded.

On the other hand, the oxygen provides non-radiative centers in the crystal. Therefore, the existence of a large amount of oxygen degrades the light emission characteristic. According to diligent experiments of the inventor, the light emission characteristic is significantly degraded by the non-radiative recombination when the oxygen concentration in the crystal exceeds $1 \times 10^{17}$ cm$^{-3}$. Therefore, to improve the light output by the oxygen in the crystal, it is desirable to control the oxygen concentration to be not more than $1 \times 10^{17}$ cm$^{-3}$.

In the semiconductor light-emitting device 1 according to the embodiment, the light output can be improved in a range that is wider than the tolerance of the strain compensation parameters in the MQW structure. Thereby, it is possible to achieve the stable manufacturing process of the semiconductor light-emitting device 1 by suppressing the fluctuation effects.

Figure 9:
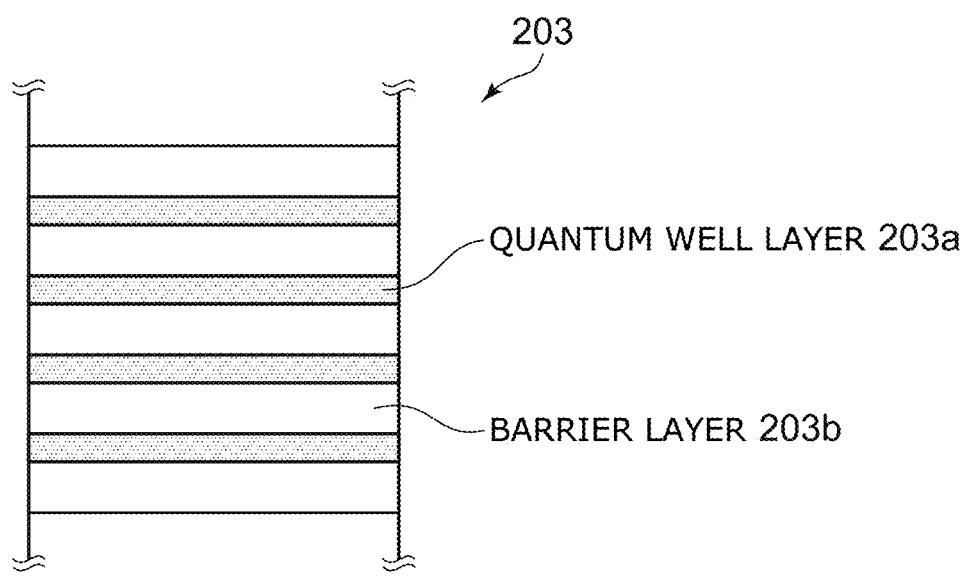
FIG. 9 is a schematic cross-sectional view showing a light-emitting layer according to a modification of the embodiment.

FIG. 9 is a schematic cross-sectional view showing a light-emitting layer 203 according to a modification of the embodiment. The light-emitting layer 203 has a MQW structure that includes a quantum well layer 203a and a barrier layer 203b.

The quantum well layer 203a includes an InGaAs mixed crystal. The InGaAs mixed crystal is provided with the In composition "X" of 0.2, for example. The quantum well layer 203a has, for example, a layer thickness of 5.8 nanometers (nm), and emits infrared light of the 950 nm wavelength.

The barrier layer 203b includes an AlGaAsP mixed crystal of the compositional formula Al$_Z$Ga$_{1-Z}$As$_{1-Y}$P$_Y$ (0<Z<1 and 0<Y<1). In the AlGaAsP mixed crystal in which Al is added to a GaAsP mixed crystal, compared to a GaAsP mixed crystal having the same P composition "Y", the energy bandgap of can be widened without significant change of the lattice constant. Accordingly, the energy bandgap of the barrier layer 203b can be widened while maintaining the balance of the strain amounts between the quantum well layer 203a and the barrier layer 203b. The carrier confinement effect of the quantum well layer 203a can be improved thereby. Also, oxygen is easily incorporated into the crystal by adding Al. Therefore, it is easier to improve the light output by increasing the oxygen concentration in the crystal. The barrier layer 203b includes, for example, an AlGaAsP mixed crystal of the compositional formula Al$_{0.1}$Ga$_{0.9}$As$_{0.9}$P$_{0.1}$ (Al composition Z=0.1 and P composition Y=0.1).

By providing the light-emitting layer 203 shown in FIG. 9 with the barrier layer thickness shown in FIG. 8, a semiconductor light-emitting device may have a light output equal to the light output of the semiconductor light-emitting device 1. The oxygen concentration in the light-emitting layer 203 is in the range of $2.5 \times 10^{15}$ to $1.0 \times 10^{17}$ cm$^{-3}$.

Embodiments are not limited to the examples described above. By considering the strain balance and oxygen concentrations of the InGaAs quantum well layers 103a and 203a, the layer thickness $d_{bar}$ and the P compositions "Y" of the GaAs$_{1-Y}$P$_Y$ barrier layer 103b and the Al$_Z$Ga$_{1-Z}$As$_{1-Y}$P$_Y$ barrier layer 203b may be appropriately determined, for example. Moreover, the In composition "X" and the layer thicknesses of the In$_X$Ga$_{1-X}$As quantum well layers 103a and 203a are appropriately determined so that the light emission wavelength is, for example, in a range of 900 nm to 1000 nm. That is, the GaAs substrate has the absorption edge at the wavelength of 900 nm; and a Si PD has the photosensitive range in which the long-wavelength end is 1000 nm. Moreover, the layer thicknesses $d_{bar}$ of the barrier layers 103b and 203b are determined in the range of 0.53 to 1.0 times the layer thickness $d_{bar}$ at which the strain amounts are balanced with respect to the InGaAs mixed crystals that are provided in the quantum well layers 103a and 203a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light-emitting device, the device comprising:
   a semiconductor substrate; and
   a light-emitting layer provided on the semiconductor substrate,
   the light-emitting layer including at least one quantum well layer and barrier layers alternately stacked in a first direction directed from the semiconductor substrate toward the light-emitting layer,
   the quantum well layer including a first semiconductor mixed crystal having a larger lattice constant than a lattice constant of the semiconductor substrate,
   the quantum well layer having a first layer thickness in the first direction and including a first strain amount, the first strain amount being a product of the first layer thickness and a first strain ratio, the first strain ratio being obtained by dividing an absolute value of a difference between the lattice constant of the substrate and a lattice spacing of the first semiconductor mixed crystal in the first direction by the lattice spacing of the first semiconductor mixed crystal,
   the barrier layers each including a second semiconductor mixed crystal having a smaller lattice constant than the lattice constant of the semiconductor substrate,
   the barrier layer each having a second layer thickness in the first direction and including a second strain amount, the second strain amount being a product of the second layer thickness and a second strain ratio, the second strain ratio being obtained by dividing an absolute value of a difference between the lattice constant of the substrate and a lattice spacing of the second semiconductor mixed crystal in the first direction by the lattice spacing of the second semiconductor mixed crystal,
   the quantum well layer and the barrier layers being provided such that the first strain amount is greater than the second strain amount.

2. The device according to claim 1, wherein
   the first semiconductor mixed crystal is an InGaAs mixed crystal of a compositional formula In$_X$Ga$_{1-X}$As (0<X<1), and
   the second semiconductor mixed crystal is one of a GaAsP mixed crystal of a compositional formula GaAs$_{1-Y}$P$_Y$ (0<Y<1) or an AlGaAsP mixed crystal of a compositional formula Al$_Z$Ga$_{1-Z}$As$_{1-Y}$P$_Y$ (0<Y<1 and 0<Z<1).

3. The device according to claim 1, wherein
   the barrier layers each have a layer thickness in a range of 0.53 to 1.0 times a value obtained by dividing the first strain amount by the second strain ratio.

4. The device according to claim 1, wherein
   the first semiconductor mixed crystal and the second semiconductor mixed crystal each include oxygen.

5. The device according to claim 4, wherein
   a concentration of the oxygen is greater than $2.5 \times 10^{15}$ cm$^{-3}$ and not more than $1.0 \times 10^{17}$ cm$^{-3}$.

6. The device according to claim 1, wherein
   the quantum well layer has the first layer thickness and the includes first semiconductor mixed crystal so that the light-emitting layer emits light with a wavelength greater than 900 nm and less than 1000 nm.

7. The device according to claim 1, wherein
   the semiconductor substrate transmits light emitted from the light-emitting layer.

8. The device according to claim 1, wherein
   the semiconductor substrate is a GaAs substrate.

9. The device according to claim 1, further comprising:
   a first semiconductor layer of a first conductivity type provided on the semiconductor substrate, the first semiconductor layer being provided between the semiconductor substrate and the light-emitting layer; and
   a second semiconductor layer of a second conductivity type provided on the light-emitting layer, the light-emitting layer being provided between the first semiconductor layer and the second semiconductor layer,
   the first semiconductor layer including a third semiconductor mixed crystal, the third semiconductor mixed crystal having a lattice constant greater than the lattice constant of the semiconductor substrate and less than the lattice constant of the first semiconductor mixed crystal of the light-emitting layer.

10. The device according to claim 9, wherein
    the third semiconductor mixed crystal is an AlGaAs mixed crystal of a compositional formula Al$_Z$Ga$_{1-Z}$As.

11. The device according to claim 10, wherein
    the second semiconductor layer includes an AlGaAs mixed crystal of a compositional formula Al$_Z$Ga$_{1-Z}$As.

12. The device according to claim 8, wherein
    the lattice spacing of the first semiconductor mixed crystal in the first direction is greater than the lattice constant of the semiconductor substrate, and
    the first semiconductor mixed crystal has a lattice spacing in a second direction orthogonal to the first direction, the lattice spacing in the second direction of the first semiconductor mixed crystal matching the lattice constant of the semiconductor substrate.

* * * * *